United States Patent
Faragi et al.

(10) Patent No.: US 6,224,393 B1
(45) Date of Patent: May 1, 2001

(54) ASSEMBLY WITH DUAL PURPOSE CONNECTOR

(75) Inventors: Eric Joseph Faragi, Boynton Beach; Richard Lee Mangold, Lake Worth, both of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/549,366

(22) Filed: Apr. 14, 2000

(51) Int. Cl.⁷ .............................. H01R 12/00; H05K 1/00
(52) U.S. Cl. ................................................................ 439/66
(58) Field of Search .................................. 439/66, 67, 86, 439/87

(56) References Cited

U.S. PATENT DOCUMENTS

| | | | |
|---|---|---|---|
| 4,357,061 | * 11/1982 | Crosby | 439/66 |
| 4,533,976 | * 8/1985 | Suwa | 361/736 |
| 5,358,412 | * 10/1994 | Maurinus et al. | 439/66 |
| 5,507,038 | 4/1996 | Cook et al. | |
| 5,822,030 | 10/1998 | Uchiyama | |
| 5,971,771 | 10/1999 | Faragi | |
| 6,023,147 | * 2/2000 | Cargin, Jr. et al. | 320/114 |

* cited by examiner

Primary Examiner—Brian Sircus
Assistant Examiner—Brian S. Webb
(74) Attorney, Agent, or Firm—Randi L. Dulaney

(57) ABSTRACT

An assembly (24) includes a front housing (26), a back housing (28), an electrical component (30) having a plurality of component conductive pads (60), a substrate (32) having a plurality of substrate conductive pads (54), a flex circuit (34) having a first plurality of flex conductive pads (42) and a second plurality of flex conductive pads (44), and a connector (36). The connector (36) is situated between the flex circuit (34) and the electrical component (30) for connecting the second plurality of flex conductive pads (44) to the plurality of component conductive pads (60). The first plurality of flex conductive pads (42) and the plurality of substrate conductive pads (54) are in alignment, and the connector (36) also compresses the assembly (24) to create an electrical connection between the first plurality of flex conductive pads (42) and the plurality of substrate conductive pads (54).

11 Claims, 5 Drawing Sheets

ASSEMBLY WITH DUAL PURPOSE CONNECTOR

BACKGROUND OF THE INVENTION

1. Field of the Invention

This invention relates to apparatus for forming an electrical connection between bonding pads or the like of an electrical component and electrical conductive pads on a substrate.

2. Description of the Related Art

Making electrical connections between an electrical component and a substrate such as a printed circuit board (PCB) in a high volume manufacturing process typically requires consideration of factors such as the pitch (center to center spacing) of the conductive runners on the electrical component, the pitch of the conductive runners on the PCB, the means of attachment between the PCB and the electrical component, and the mechanical forces on the connection.

In the past, when the pitch of the pads and conductors was large enough, a conventional elastomeric connection could be used to electrically connect the pads on the electrical component to the conductors on the PCB. One drawback of the conventional elastomeric connection is the mechanical integrity. Additional mechanical components are typically required to maintain the integrity of the mechanical connection during shock or drop of the electrical component to PCB assembly. Another drawback to the conventional elastomeric connection is that components mounted in close proximity to the elastomeric connection may be subject to additional mechanical forces, leading to integrity concerns of the component during shock and drop of the assembly.

In the past, alignment requirements of conductive runners with small pitches (less than 0.050 inch (1.27 mm)) have typically required the use of a HSC (Heat Seal Connector) type connection.

FIG. 1 illustrates the use of a conventional HSC 10 for electrically connecting a plurality of component conductive pads 12 on a LCD (Liquid Crystal Display) panel 14 to a plurality of substrate conductive pads 16 on a PCB 18. The substrate conductive pads 16 are coupled to electrical parts (not shown) on the PCB 18.

A conventional HSC 10 is used as the connecting mechanism. The illustrated conventional HSC 10 has a first set of conductive pads 20 bonded on one side by heat sealing to the component conductive pads 12 on the LCD panel 14, and a second set of conductive pads 22 bonded on the other side to the substrate conductive pads 16 on the PCB 18.

One drawback of the illustrated heat seal connection is the cost of heat seal technology and assembly equipment and also the vertical height required for the connection. Further, electrical parts located close to the connection can be subject to mechanical stresses during shock and drop of the assembly similar to the assembly using the elastomeric connection.

What is needed is a low profile method and apparatus to electrically connect an electrical component and a PCB without the use of additional mechanical components required to provide mechanical integrity and shock protection of the connection and the proximately located electrical parts.

DETAILED DESCRIPTION OF THE INVENTION

Figure 2:
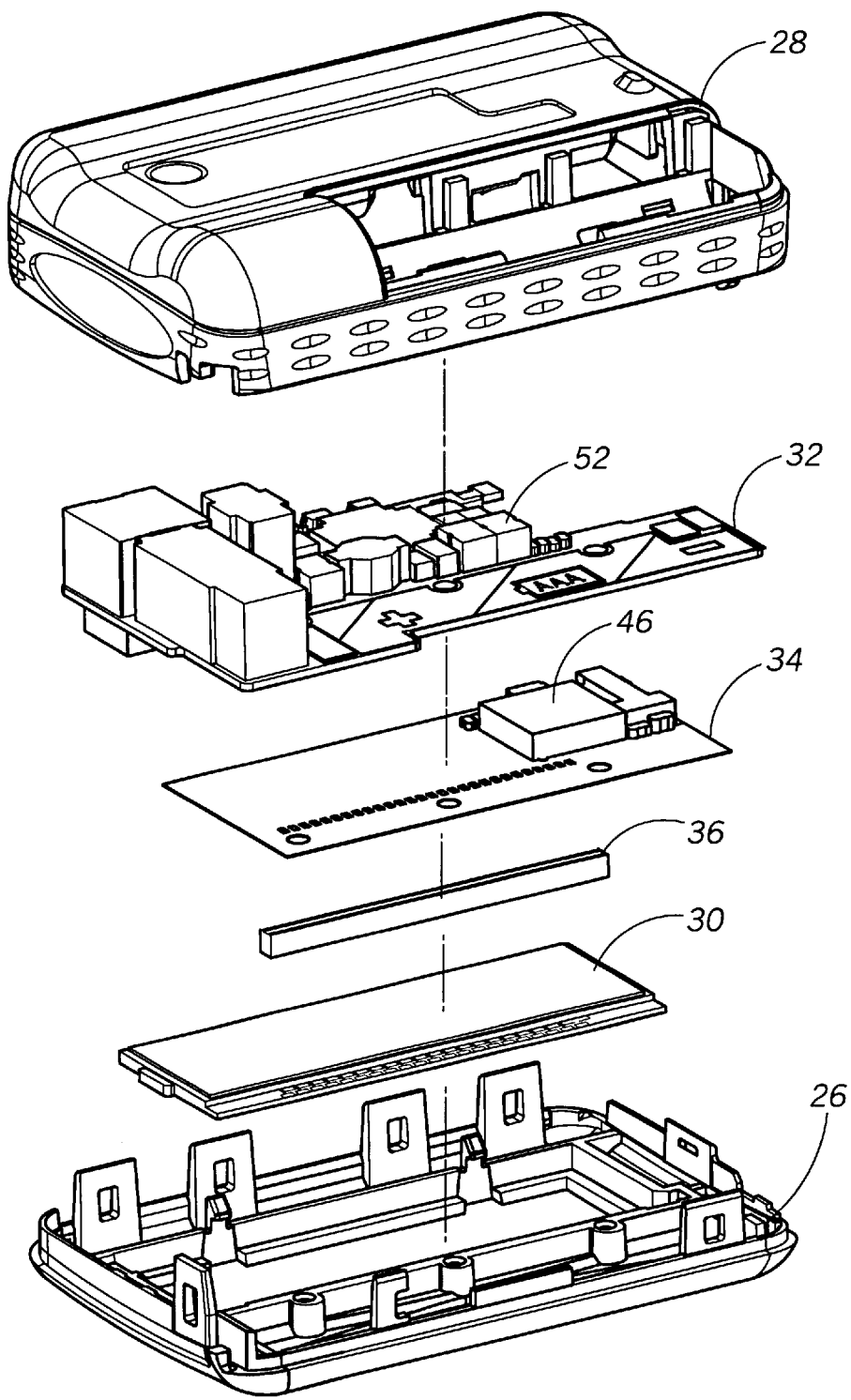
FIG. 2 is an exploded view of an assembly that is constructed according to the present invention.

Referring to FIG. 2, an assembly 24, which is constructed in accordance with the present invention, includes a front housing 26, a back housing 28, an electrical component 30, a substrate 32, a flex circuit 34 and a connector 36. The electrical component 30 rests on a ledge of the front housing 26; and is held securely in the front housing 26. The electrical component 30 is driven by a flex electronic circuit 46 located on the flex circuit 34 and a substrate electronic circuit 52 located on the substrate 32. Electrical connections between the flex electronic circuit 46 and the electrical component 30 are made via pads (not shown in FIG. 2) situated on the electrical component 30 and pads (not shown in FIG. 2) on the flex circuit 34 through the connector 36. Electrical connections between the substrate electronic circuit 52 and the electrical component 30 are made through the flex circuit 34 via pads (not shown in FIG. 2) on the substrate 32 contacting to pads (not shown in FIG. 2) on the flex circuit 34. The present invention, as described herein, permits a low profile electrical connection while enhancing mechanical reliability of the assembly 24. Consequently, the assembly 24 is well suited for use in products that are produced in high volumes, such as pagers, cellular telephones, portable computing devices, and the like.

Figure 3:
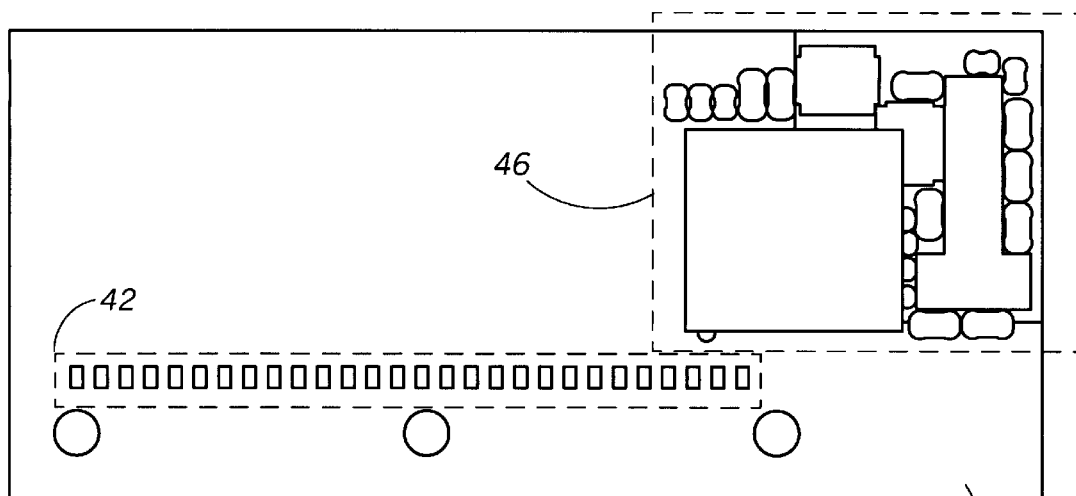
FIGS. 3 and 4 illustrate a flex circuit for use in the assembly of FIG. 2.
Figure 4:
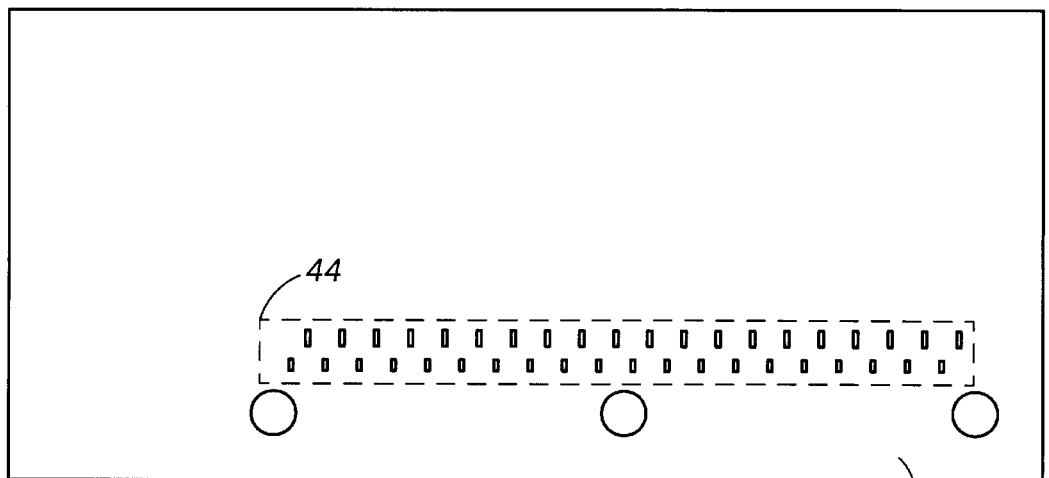

FIGS. 3 and 4 illustrate a preferred embodiment of the flex circuit 34, shown in FIG. 2, in accordance with the present invention. The flex circuit 34, for example, may be manufactured from a polyimide film, polyester film, or similar material; and typically has a thickness in the range of 0.001 to 0.005 inches (0.025 mm to 0.127 mm). It will be appreciated that other materials can be utilized for the flex circuit 34; and that additional flex circuits of the same or alternative type can be added as required to handle the requirements of the flex circuit 34. The flex circuit 34 is comprised of a first flex side 38 (FIG. 3) and a second flex side 40 (FIG. 4).

Referring to FIG. 3, a first plurality of flex conductive pads 42 is located on the first flex side 38 of the flex circuit 34. The first plurality of flex conductive pads 42 is preferably comprised of a single row of conductive pads of substantially similar size, each pair of conductive pads separated by a pad spacing of substantially similar size. Alternatively, the first plurality of flex conductive pads 42 is comprised of multiple rows of conductive pads with substantially dissimilar dimensioned pads and substantially dissimilar sized pad spacing. It will be appreciated by one skilled in the art that other variations of the arrangement of the conductive pads of the first plurality of conductive pads 42 are within the scope of the present invention.

Referring to FIG. 4, a second plurality of flex conductive pads 44 is located on the second flex side 40 of the flex circuit 34. The second plurality of flex conductive pads 44 is preferably comprised of a single row of conductive pads of substantially similar size, each pair of conductive pads separated by a pad spacing of substantially similar size. Alternatively, the second plurality of flex conductive pads 44 is comprised of multiple rows of conductive pads with substantially dissimilar sized pads and substantially dissimilar sized spacing. It will be appreciated by one skilled in the art that other variations of the arrangement of the conductive pads of the second plurality of conductive pads 44 are within the scope of the present invention. The first plurality of flex conductive pads 42 and the second plurality of flex conductive pads 44 are preferably electrically connected within the flex circuit 34.

Referring to FIG. 3, the flex electronic circuit 46 is preferably located on the first flex side 38 and electrically connected to the first plurality of flex conductive pads 42. Alternatively, the flex electronic circuit 46 is located on the second flex side 40 and electrically connected to the second plurality of flex conductive pads 44.

The flex electronic circuit 46 preferably includes discrete electronic components for electrical interface between the substrate 32 and the electrical component 30. The flex electronic circuit 46, may be, for example, the display driver circuitry comprised of a display driver die assembled to the flex circuit 34 using a direct chip attachment (DCA) technology. Since finer lines and spaces can be routed on flexible substrates such as the flex circuit 34, flexible substrates provide a reduced cost and increased reliability carrier for mounting display driver die such as the flex electronic circuit 46 over rigid PCBs. Isolating the display driver die in the DCA package from any stresses relating to the rigid substrate enhances reliability of the assembly. Further, scrap cost is reduced because the flex circuit 34 can be tested independent of the substrate 32 prior to assembly.

Figure 5:
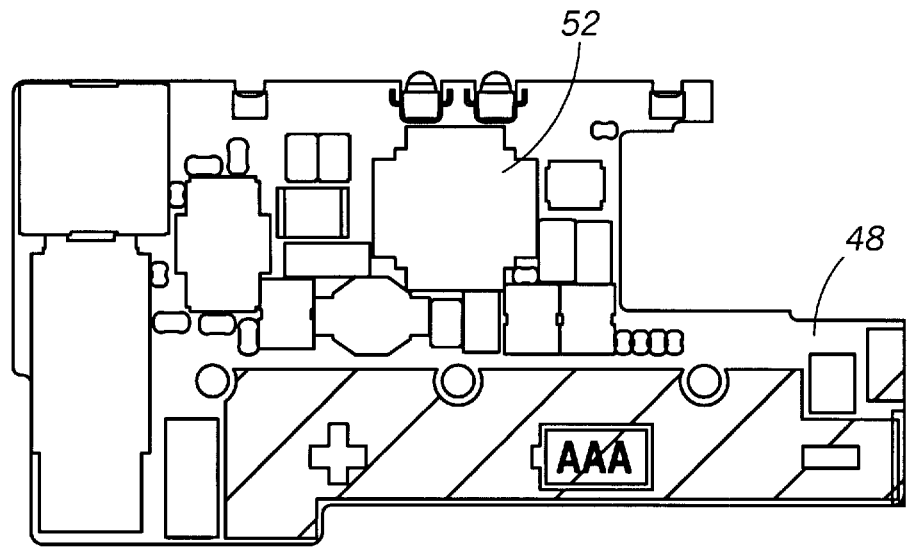
FIGS. 5 and 6 illustrate a substrate for use in the assembly of FIG. 2.
Figure 6:
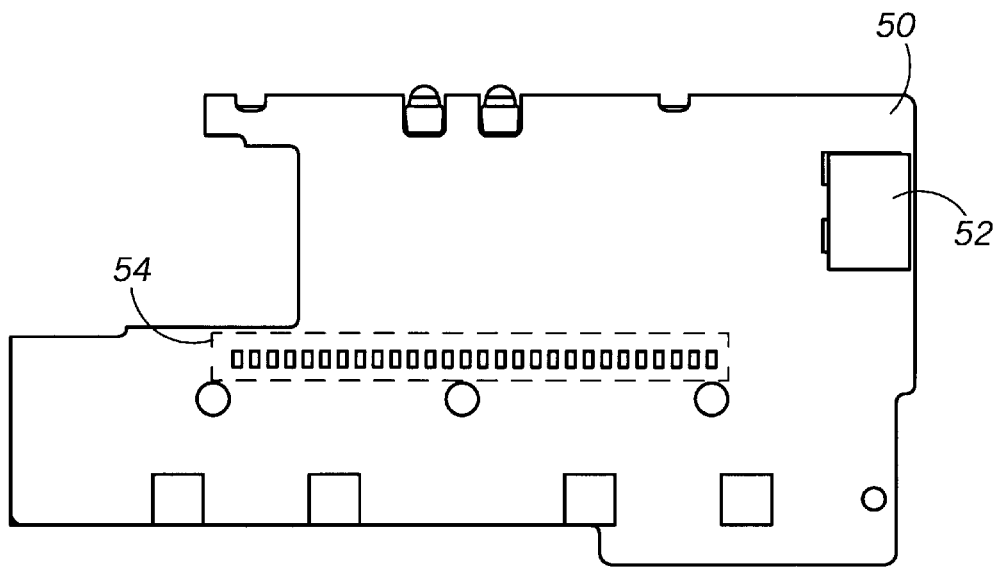

FIGS. 5 and 6 illustrate a preferred embodiment of the substrate 32 shown in FIG. 2, in accordance with the present invention. The substrate 32 is preferably a printed circuit board (PCB). The PCB, for example, is a composite of glass and epoxy, polyamide, or similar dielectric material. It will be appreciated that other materials can be utilized for the substrate 32; and that additional substrates of the same or alternative type can be added as required to handle the requirements of the substrate 32. The substrate 32 includes a first substrate side 48 (FIG. 5) and a second substrate side 50 (FIG. 6). A substrate electronic circuit 52 is located on both the first substrate side 48 and the second substrate side 50. It will be appreciated by one skilled in the art that the substrate electronic circuit 52 alternatively is located on either the first substrate side 48 or the second substrate side 50 of the substrate 32.

Referring to FIG. 6, a plurality of substrate conductive pads 54 is located on the second substrate side 50. The plurality of substrate conductive pads 54 is preferably comprised of a single row of conductive pads of substantially similar size, each pair of conductive pads separated by a pad spacing of substantially similar size. Alternatively, the plurality of substrate conductive pads 54 is comprised of multiple rows of conductive pads with substantially dissimilar sized pads and substantially dissimilar sized spacing. It will be appreciated by one skilled in the art that other variations of the arrangement of the conductive pads of the plurality of substrate conductive pads 54 are within the scope of the present invention. The substrate electronic circuit 52 is electrically connected to the plurality of substrate conductive pads 54. The substrate electronic circuit 52, for example, may be traditional decoder circuitry for processing information within the assembly 24.

Figure 1:
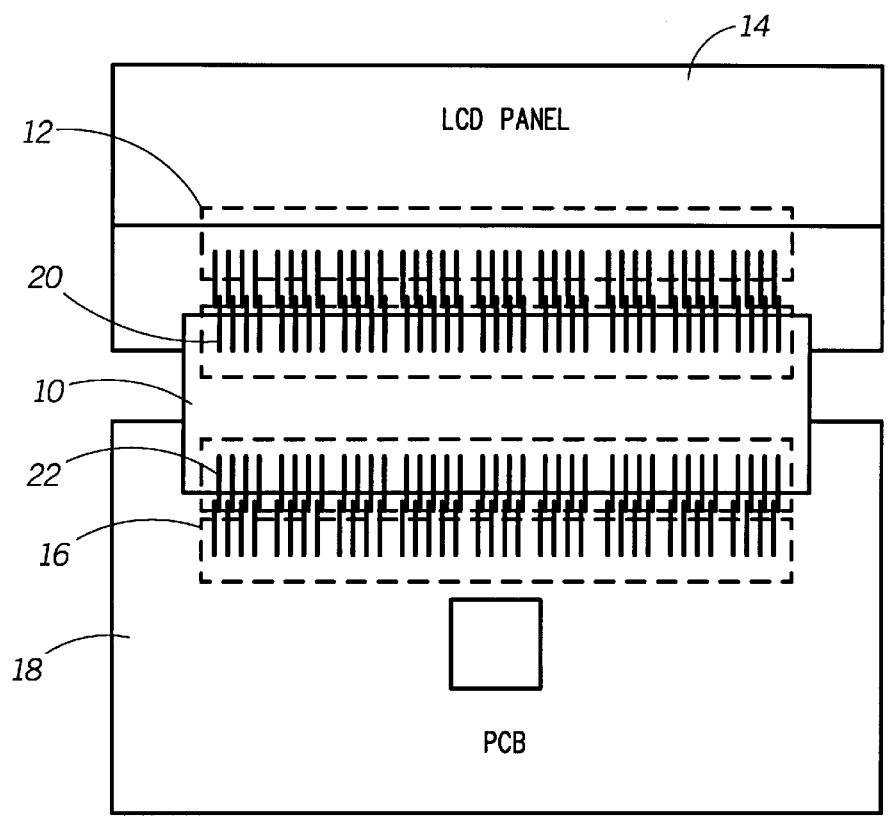
FIG. 1 illustrates a conventional technique for making electrical connections between an electrical component and a substrate.
Figure 7:
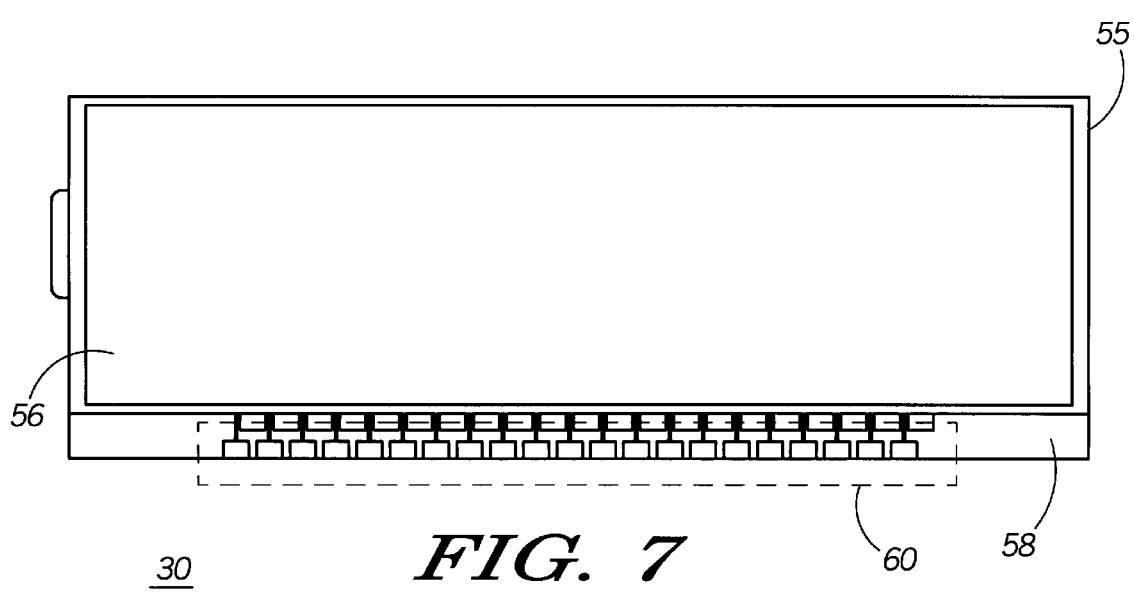
FIG. 7 illustrates a liquid crystal display for use in the assembly of FIG. 2.

FIG. 7 illustrates a preferred embodiment of the electrical component 30, shown in FIG. 2, wherein the electrical component 30 is by way of example a liquid crystal display (LCD) 55. The LCD 55 may be, for example, a full or partial starburst liquid crystal display utilized to display text. Alternatively, the LCD 55 may be a high resolution graphics liquid crystal display. It will be appreciated that other similar displays can be utilized for the LCD 55. The LCD 55 is, for example, composed of two panes of glass or plastic typically plated with Indium Tin Oxide sealed together and filled with liquid crystal material. It will be appreciated that additional displays of the same or alternative type can be added as required to handle the requirements of the LCD 55. The LCD 55 is comprised preferably of a glass surface 56 and includes a bonding shelf 58 having a plurality of component conductive pads 60. The plurality of component conductive pads 60 is preferably comprised of a single row of conductive pads of substantially similar size, each pair of conductive pads separated by a pad spacing of substantially similar size. Alternatively, the plurality of component conductive pads 60 is comprised of multiple rows of conductive pads with substantially dissimilar sized pads and substantially dissimilar sized spacing. It will be appreciated by one skilled in the art that other variations of the arrangement of the conductive pads of the plurality of component conductive pads 60 are within the scope and spirit of the present invention. The flex electronic circuit 46 drives the LCD 55 on the flex circuit 34 and the substrate electronic circuit 52 on the substrate 32. The plurality of component conductive pads 60 receives the signals for driving the LCD glass 56.

Figure 8:
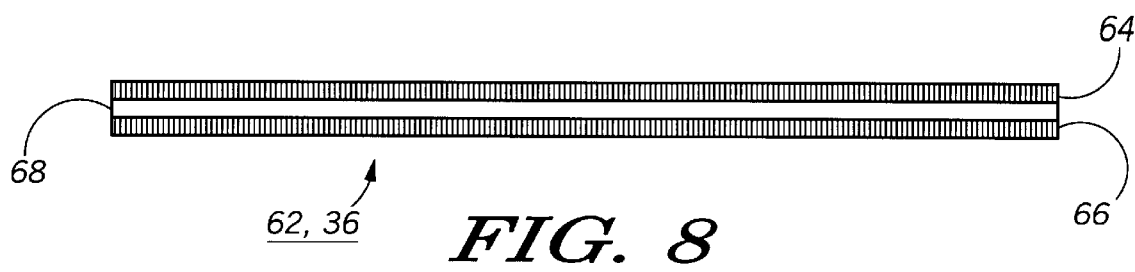
FIG. 8 illustrates a connector for use in the assembly of FIG. 2.

As illustrated in FIG. 8, preferably, the connector 36 shown in FIG. 2, in accordance with the present invention, is a conductive elastomer 62. The conductive elastomer 62 is, for example, composed of polymer foam or silicone impregnated with carbon, silver, gold, or a similar conductive medium. The conductive elastomer 62 is of conventional construction, having a first row of conductors 64 and a second row of conductors 66. The conductors of the first row of conductors 64 and the second row of conductors 66, usually made of carbon or conductive wires, extend vertically through the conductive elastomer 62 to its opposite surface. Non-conductive silicon or foam 68 insulates the conductors from each other. The conductive elastomer 62 is less labor intensive to install than a traditional HSC, and, as a secondary effect, provides cushioning for the flex electronic circuit 46, enhancing the quality of the assembly 24.

Figure 9:
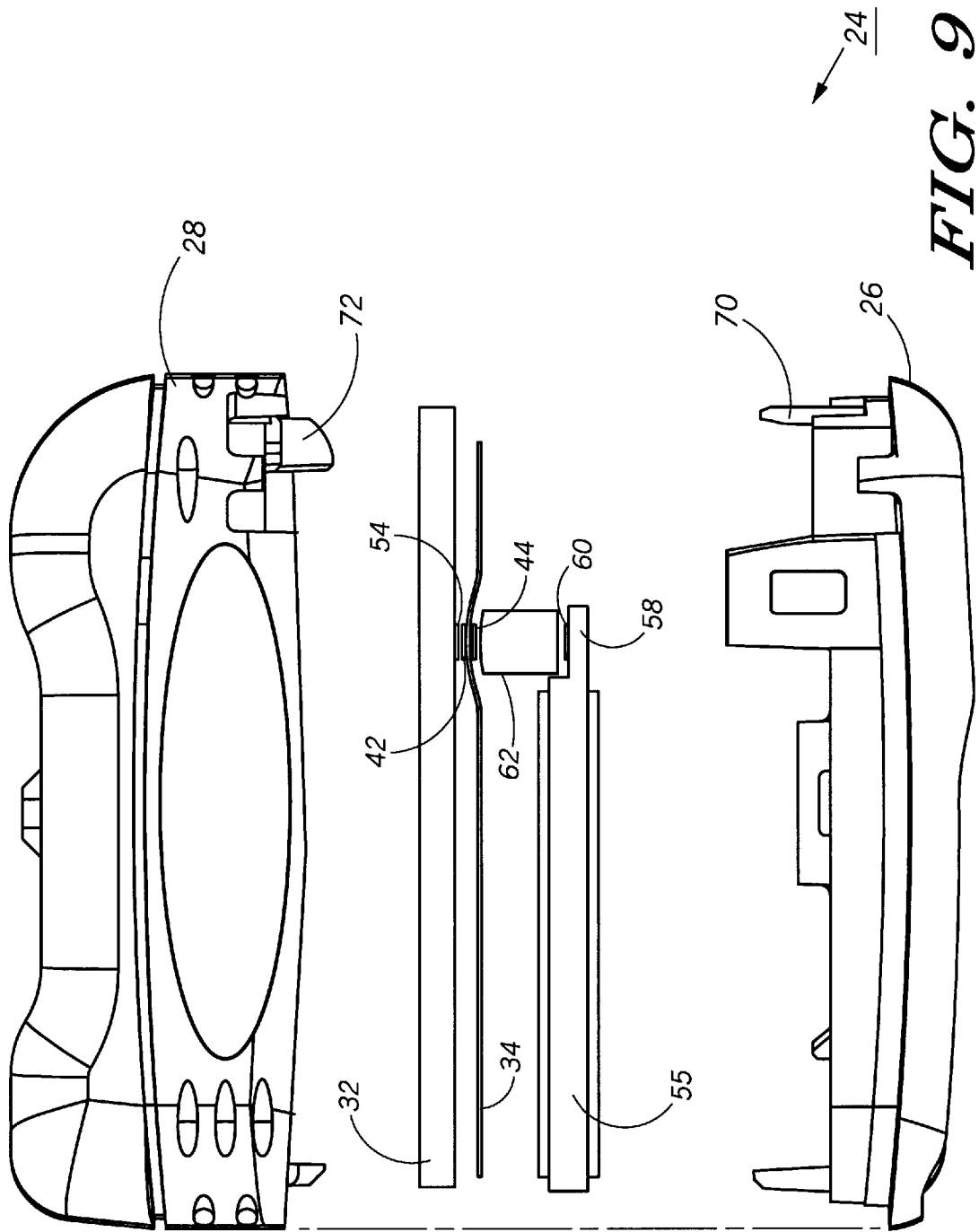
FIG. 9 is a side view of the assembly of FIG. 2.

FIG. 9 is a side view of the assembly 24 shown in FIG. 2, in accordance with the present invention. As illustrated in FIG. 9, when the assembly 24 is fully assembled, electrical connections are made between the flex electronic circuit 46, the substrate electronic circuit 52, and the LCD 55. The electrical connections are made via the plurality of component conductive pads 60, the first plurality of flex conductive pads 42, the second plurality of flex conductive pads 44, and the plurality of substrate conductive pads 54.

In the assembly 24, the LCD 55 rests on the front housing 26. The conductive elastomer 62 is situated on the bonding shelf 58 of the LCD 55 such that the plurality of component conductive pads 60 contact the first row of conductors 64 of the conductive elastomer 62.

The flex circuit 34 is situated atop the conductive elastomer 62 such that the second plurality of flex conductive pads 44 contacts the second row of conductors 66 of the conductive elastomer 62.

To form the various electrical connections, the plurality of component conductive pads 60 is preferably in alignment with the second plurality of flex conductive pads 44 and electrically connected through the conductive elastomer 62. The conductive elastomer 62 is situated between the plurality of component conductive pads 60 and the second plurality of flex conductive pads 44. An electrical connection is created when the conductive elastomer 62 is in contact with both the plurality of component conductive pads 60 and the second plurality of flex conductive pads 44.

The substrate 32 is situated atop the flex circuit 34 such that the first plurality of flex conductive pads 42 contact the plurality of substrate conductive pads 54. Preferably, the first plurality of flex conductive pads 42 is in alignment with the plurality of substrate conductive pads 54. An electrical connection is created when the first plurality of flex conductive pads 42 is in contact with the plurality of substrate conductive pads 54.

The back housing 28 is assembled to the front housing 26 to close the product. When the back housing 28 is attached to the front housing 26, the conductive elastomer 62 is compressed. The conductive elastomer 62 resultantly contacts both the flex circuit 34 and the LCD 55; and further for the substrate 32 to contact the flex circuit 34, thus completing all electrical connections required for the assembly 24.

Preferably, the front housing 26 includes a front alignment feature 70 to align the flex circuit 34, substrate 32, and LCD 55 within the front housing 26. Alternatively the back housing 28 includes a back alignment feature 72 to align the flex circuit 34, substrate 32, and LCD 55 within the back housing 26. Alternatively, the flex circuit 34 is held to the substrate 32 using an adhesive. It will be appreciated that other similar methods can be utilized to accomplish the mechanical alignment.

During compression caused by the assembly of the back housing 28 to the front housing 26, the elastomer force curves the first plurality of flex conductive pads 42 to make connection to the plurality of substrate conductive pads 54.

In summary, the flex circuit 34 is placed underneath the substrate 32 and electrical connection is accomplished using pressure from the elastomer 66 below the flex circuit 34. The conductive elastomer 62 also makes electrical connection between the flex circuit 34 and the LCD 55. The conductive elastomer 62 therefor serves two purposes: it serves to connect the substrate 32 to the flex circuit 34 via mechanical pressure, and it serves to connect the flex circuit 34 to the LCD 55 through its conductive media. The manner of assembling the electrical connections between the electrical component 30 and the flex circuit 34; and the flex circuit 34 and the substrate 32 according to the present invention as described herein minimizes the size, cost, and quantity of mechanical components required to make these connections and assure mechanical integrity of the assembly 24. Consequently, the assembly 24 is well suited for use in electronic display products that are produced in high volume, such as pagers, cellular telephones, and the like.

Although the present invention has been described in terms of preferred embodiments, it will be obvious to one skilled in the art that various alterations and modifications may be made without departing from the scope and spirit of the present invention. Accordingly, it is intended that all such alterations and modifications be considered as within the spirit and scope of the invention as defined by the appended claims.

What is claimed is:

1. An assembly including an electrical component and a substrate, wherein the electrical component and the substrate are electrically connected, the assembly comprising:

the substrate, wherein the substrate includes a plurality of substrate conductive pads;

the electrical component, wherein the electrical component includes a plurality of component conductive pads;

a flex circuit, wherein the flex circuit includes a first flex side having a first plurality of flex conductive pads and a second flex side having a second plurality of flex conductive pads; and a connector, situated between the flex circuit and the electrical component, wherein the connector comprises:

a first row of conductors electrically coupled to the second plurality of flex conductive pads and to the plurality of component conductive pads for electrically connecting the second plurality of flex conductive pads to the plurality of component conductive pads, and a second row of conductors electrically coupled to the first plurality of flex conductive pads, wherein the first plurality of flex conductive pads and the plurality of substrate conductive pads are in alignment, and further wherein the connector compresses the assembly, creating an electrical connection between the first plurality of flex conductive pads and the plurality of substrate conductive pads.

2. An assembly as recited in claim 1 wherein the second plurality of flex conductive pads are in alignment with the plurality of component conductive pads.

3. An assembly as recited in claim 1 wherein the connector is a conductive elastomer.

4. An assembly as recited in claim 1 further comprising:

a front housing, wherein the front housing includes a front alignment feature to align the substrate, the flex circuit, and the electrical component.

5. An assembly as recited in claim 1 further comprising:

a back housing, wherein the back housing includes a back alignment feature to align the substrate, the flex circuit, and the electrical component.

6. An assembly including an electrical component and a substrate, wherein the electrical component and the substrate are electrically connected, the assembly comprising:

the substrate, wherein the substrate includes:

a plurality of substrate conductive pads, and a substrate electronic circuit electrically connected to the plurality of substrate conductive pads;

the electrical component, wherein the electrical component includes a plurality of component conductive pads;

a flex circuit, wherein the flex circuit includes:

a first plurality of flex conductive pads located on a first flex side, second plurality of flex conductive pads located on a second flex side, wherein the second plurality of flex conductive pads is electrically connected to the first plurality of flex conductive pads, and a flex electronic circuit located on the first flex side and electrically connected to the first plurality of flex conductive pads;

a connector, situated between the flex circuit and the electrical component, wherein the connector comprises:

a first row of conductors electrically coupled to the second plurality of flex conductive pads and to the plurality of component conductive pads for electrically connecting the second plurality of flex conductive pads to the plurality of component conductive pads, and a second row of conductors electrically coupled to the first plurality of flex conductive pads, wherein the first plurality of flex conductive pads and the plurality of substrate conductive pads are in alignment, and further wherein the connector compresses the assembly, creating an electrical connection between the first plurality of flex conductive pads and the plurality of substrate conductive pads.

7. A display assembly, comprising:

a liquid crystal display having a bonding shelf, wherein the liquid crystal display includes a plurality of component conductive pads on the bonding shelf;

a substrate, wherein the substrate includes a plurality of substrate conductive pads on the surface of the substrate;

a flex circuit, wherein the flex circuit includes a first flex side having a first plurality of flex conductive pads and a second flex side having a second plurality of flex conductive pads;

a connector, situated between the bonding shelf and the flex circuit, wherein the connector comprises:

a first row of conductors electrically coupled to the second plurality of flex conductive pads and to the plurality of component conductive pads for electrically connecting the second plurality of flex conductive pads to the plurality of component conductive pads, and a second row of conductors electrically coupled to the first plurality of flex conductive pads, wherein the first plurality of flex conductive pads and the plurality of substrate conductive pads are in alignment, and further wherein the connector compresses the display assembly, creating an electrical connection between the first plurality of flex conductive pads and the plurality of substrate conductive pads.

8. A display assembly as recited in claim 7 wherein the second plurality of flex conductive pads are in alignment with the plurality of component conductive pads.

9. A display assembly as recited in claim 7 wherein the connector is a conductive elastomer.

10. A display assembly as recited in claim 7 further comprising:

a front housing, wherein the front housing includes a front alignment feature to align the substrate, the flex circuit, and the liquid crystal display.

11. A display assembly as recited in claim 7 further comprising:

a back housing, wherein the back housing includes a back alignment feature to align the substrate, the flex circuit, and the liquid crystal display.

* * * * *